(12) United States Patent
Peng et al.

(10) Patent No.: US 7,153,703 B2
(45) Date of Patent: Dec. 26, 2006

(54) SYNTHESIS OF STABLE COLLOIDAL NANOCRYSTALS USING ORGANIC DENDRONS

(75) Inventors: Xiaogang Peng, Fayetteville, AR (US); Haiyan Chen, Fayetteville, AR (US)

(73) Assignee: Board of Trustees of the University of Arkansas N. A., Little Rock, AR (US)

( * ) Notice: Subject to any disclaimer, the term of this patent is extended or adjusted under 35 U.S.C. 154(b) by 653 days.

(21) Appl. No.: 10/146,420

(22) Filed: May 13, 2002

(65) Prior Publication Data

US 2004/0101976 A1 May 27, 2004

Related U.S. Application Data

(60) Provisional application No. 60/290,541, filed on May 14, 2001.

(51) Int. Cl.
*G01N 33/551* (2006.01)
(52) U.S. Cl. ...................... 436/524; 436/525
(58) Field of Classification Search ............... 436/524, 436/525
See application file for complete search history.

(56) References Cited

U.S. PATENT DOCUMENTS

| | | | |
|---|---|---|---|
| 5,260,957 A | 11/1993 | Hakimi et al. | |
| 5,427,767 A | 6/1995 | Kresse et al. | |
| 5,565,215 A | 10/1996 | Gref et al. | |
| 5,990,479 A | 11/1999 | Weiss et al. | |
| 6,074,979 A | 6/2000 | Hagemeyer et al. | |
| 6,194,213 B1 | 2/2001 | Barbera-Guillem | |
| 6,326,144 B1 | 12/2001 | Bawendi et al. | |
| 6,576,291 B1 | 6/2003 | Bawendi et al. | |
| 6,607,829 B1 | 8/2003 | Bawendi et al. | |
| 6,617,583 B1 | 9/2003 | Bawendi et al. | |
| 6,664,315 B1 * | 12/2003 | Tomalia et al. ............. | 523/218 |
| 2002/0066401 A1 | 6/2002 | Peng et al. | |
| 2002/0071952 A1 | 6/2002 | Bawendi et al. | |

FOREIGN PATENT DOCUMENTS

EP      09 977 212 A2    2/2000

OTHER PUBLICATIONS

Derwent Publication #XP002262148, Sep. 18, 2002, Abstract.
Kim et al., "Novel Dendron-Stablized Gold Nanoparticles with High Stability and Narrow Size Distribution", Chemical Communications, vol. 7, No. 7, Mar. 21, 2001, pp. 667-668.
Wang et al., "Dendron-Controlled Nucleation and Growth of Gold Nanoparticles", Angewandte Chemie International Edition, vol. 40, No. 3, Feb. 2, 2001, pp. 549-552.

* cited by examiner

*Primary Examiner*—Christopher L. Chin
(74) *Attorney, Agent, or Firm*—J. Clinton Wimbish; Charles W. Calkins; Kilpatrick Stockton LLP

(57) ABSTRACT

A method for stabilizing colloidal suspensions of nanocrystals or nanoparticles in a solvent or solid matrix is provided by coating the nanocrystals with bulky organic molecules, specifically dendrons. By coating nanocrystals with a dense organic dendron coat and further cross-linking the dendron ligands, oxidation of the nanocrystals and dissociation of the ligands are avoided. This invention allows nanocrystals to undergo rigorous purification and processing. It may regularly be applied to a variety of nanocrystals.

23 Claims, 10 Drawing Sheets

SYNTHESIS OF STABLE COLLOIDAL NANOCRYSTALS USING ORGANIC DENDRONS

CROSS-REFERENCE TO RELATED APPLICATIONS

This U.S. utility Patent Application claims priority to U.S. Provisional patent application 60/290,541, filed on May 14, 2001.

STATEMENT REGARDING FEDERALLY SPONSORED RESEARCH OR DEVELOPMENT

Not applicable.

REFERENCE TO A SEQUENCE LISTING A TABLE, OR A COMPUTER PROGRAM LISTING COMPACT DISC APPENDIX

Not applicable.

BACKGROUND OF THE INVENTION

1. Field of the Invention

The present invention relates to the use of organic ligands to stabilize nanocrystal colloids in solution. More specifically, the present invention relates to the use of ligands, especially cross linked ligands, to prevent oxidation, deterioration, precipitation and segregation of nanocrystals in a colloidal suspension or solid matrix.

2. Prior Art

Nanotechnology is one of the fastest growing fields in the industry. Microscopic devices have countless applications. Currently, the chemistry behind synthesis and processing of nanomaterials are the two key areas of research scientists are focusing on. Once nanomaterials can be readily synthesized and processed, almost any device could be formed on a nanoscopic scale.

Colloidal nanocrystals are nanometer sized fragments of corresponding bulk crystals dispersed in solvents or other types of matrices. They are one of the many materials being explored for a variety of applications because of their novel, size dependent properties and potentially flexible processing chemistry. In some cases, the nanometer sized particles may not be crystalline materials. Nanocrystals and nanoparticles show promise for use as light emitting diodes (LEDs), labels for bioassays and a host of other applications. Recent progress in the synthesis of high quality of nanocrystals, especially chalcogenides nanocrystals for use as semiconductors, as highlighted the need for methods for maintaining and handling these nanocrystals. Adequate methods of processing nanocrystals are essential for utilizing them in nanodevices and other nanostructures. For example, the size dependent emission properties of semiconductor nanocrystals make them highly desirable as labeling reagents for biomedical applications and as color tunable emitting materials in LEDs and lasers.

Compared to conventional photoluminescence-based labeling reagents, semiconductor nanocrystals possess many invaluable advantages. With their very narrow but size-dependent band-edge emission spectrum and their extremely broad absorption spectrum, semiconductor nanocrystals simplify the current detection scheme significantly. The emission of semiconductor nanocrystals can last magnitudes longer than that of conventional organic dyes under optical radiation. By simply tuning the size of very few kinds of semiconductor nanocrystals, the detection window can cover the same wavelength range of tens of different organic dyes.

In addition, conjugation chemistry for coupling different sizes/types of semiconductor nanocrystals with bio-functional species can potentially be the same because the coupling reactions always occur on the outer surface of the ligand layer. This has already been shows with cadmium selenide nanocrystals having a zinc sulfite shell and a thiol-silica ligand layer. Unfortunately, this process is very difficult to reproduce and the resulting nanocrystals deteriorate rapidly and are not well suited for subsequent purification procedures.

Ligands on the surface of colloidal nanocrystals, sometimes also called capping groups or surfactants, etc., are certain types of organic molecules with two distinguishable parts. One part of the molecule can chemically bind to the surface of the inorganic nanocrystals (or nanoparticles), and the other part helps the nanocrystals (or nanoparticles) to be dispersible in solvents or matrices.

Nanocrystals often precipitate out of solution because of the loss of their thiol ligands. One method of alleviating this problem is to use di-thiol ligands to increase stability. Unfortunately, the process is still difficult and the nanocrystals still deteriorate relatively rapidly.

One of the significant problems with nanocrystals is their tendency to rapidly oxidize and loose their unique properties. Another difficulty with nanocrystals is their low solubility. Die to their size, they must be held in a colloidal suspension, and are by their very nature insoluble. The use of thiol ligands has been an attempt to solve both of these problems.

By attaching ligands to the surface of the nanocrystals, it has been hoped that this would sterically hinder oxidation. While ligands do have a slight impact on oxidation, they have to date been unable to give nanocrystals the stability necessary for desired applications.

Similarly, ligands have so far proved disappointing in being able to maintain a colloidal suspension of nanocrystals. Functional groups having desired hydrophobic or hydrophilic properties have been attached to the ends of the ligands and do in fact aid to maintain a colloidal suspension. However, because the ligands dissociate, the colloids have a relatively short life time.

It is therefore desirable to provide a method of maintaining a colloidal suspension of nanocrystals for a very long time.

It is also desirable to provide a method for preventing oxidation of nanocrystals.

SUMMARY OF THE INVENTION

In the present invention, dendron ligands are attached to a nanocrystal or nanoparticle and may be subsequently cross linked. By cross linking the ligands, they are more tightly held about the nanocrystal and dissociation is prevented. In addition, the cross linking of the bulky dendron ligands prevents oxygen molecules from getting close enough to the nanocrystal to facilitate oxidation.

Dendrons are hyper-branched organic molecules with a focal point. In this invention, the focal point is used as the binding site to the surface of inorganic nanocrystals, or nanoparticles. Typically, dendrons only refer to molecules having regular branched structures. However, in this invention, dendrons also include molecules that are irregularly branched.

In the present invention it is preferred to use multibranched dendrons rather than more common single chair ligands. A multi branched dendron possesses many advantages over single chain ligands. The additional mass greatly enhances the protection against oxidation. It also increases the number of functional groups that interact with the solution in order to suspend the nanocrystal. Another advantage is that it provides additional functional groups for cross linking.

Because each dendron ligand possesses several functional groups capable of cross linking, there is no need to the cross linking reaction to completion. With only one or two functional groups cross linked with a neighboring dendron ligand, oxidation rate greatly decreases and dissociation is avoided. Nanocrystals protected by the present invention will last indefinitely if the inorganic nanocrystal ores are chemically stable in a given environment. In addition, they will readily survive the rigorous processing and purification methods necessary for some applications such as biomedical labeling.

It is therefore an object of the present invention to provide a method of reducing oxidation of a nanocrystal in solution.

It is another object of the present invention to provide a method a method for forming colloidal suspension of nanocrystals having long term stability.

DETAILED DESCRIPTION OF THE PREFERRED EMBODIMENTS

Figure 1:
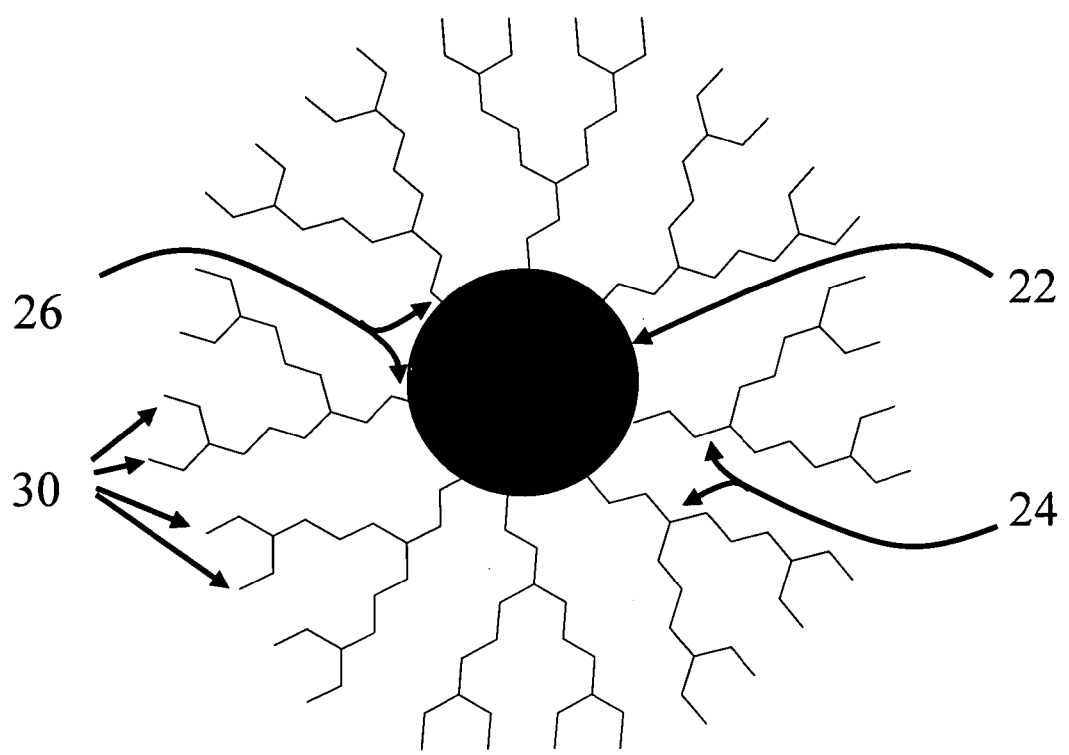
FIG. 1 shows the diagrammatic illustration of a dendron protected nanocrystal.

The present invention is directed to the development of organic dendron ligands and other bulky molecules, which improve the stability of colloidal suspensions of inorganic nanocrystals. Because of the steric crowding characteristics and wide variety of complex secondary/tertiary structures of these molecules, these ligands may be densely packed and cross linked to form a dense, compact ligand layer completely coating a nanocrystal. These dendron protected nanocrystals (DP-nanocrystals) form highly stable nanocrystal colloidal suspension. Furthermore, these DP-nanocrystals are stable enough to readily withstand coupling reactions and purification and separation techniques required for biomedical and other applications. Those skilled in the art will appreciate that by changing the functional groups at the nanoparticle binding sites (NBS's) and active sites, it is possible to apply these protective ligands to any type of nanocrystal in any type of solution or solid matrix.

"Nanocrystal" refers to a nanometer-scale crystalline particle. While the invention is described in terms of nanocrystals, the invention may be used for the stabilization of any nanoparticle, whether it is crystalline or not. Those skilled in the art will appreciate that so long as there is a suitable functional group capable of covalently attaching to the nanoparticle at the focal point of the dendron.

"Ligand" refers to molecules having one or more chains that are used to stabilize nanoparticles. Ligands have a focal point on one end where it binds to the nanoparticle, and at least one active site that either interacts with the surrounding environment, cross-links with other active sites, or both.

"Active site" refers to sites on the ligand designed to perform one or two functions. They are generally located at the ends of chains furthest from the nanoparticle or nanocrystal being stabilized. Active sites are partially determined by the environment into which the nanocrystal is placed. E.g., polar active sites are used in polar environments.

"Nanoparticle binding site," "nanocrystal binding site" and "NBS" refer to the focal point of a ligand that covalently binds to a nanoparticle or nanocrystal.

The present invention results from the discovery that the packing density of the ligand layer surrounding a nanocrystal plays a key role in determining the stability of the nanocrystal. CdSe nanocrystals coated with single chain thiol ligands were studied first. The results demonstrated that the stability of the thiol coated CdSe nanocrystals is not associated with the electron donating ability of the thiol group. Therefore, di-thiol ligands do not improve the photochemical and chemical stability of nanocrystals, because they have a greater tendency to form disulfides through intra-molecular reactions. For single chain hydrocarbon thiol ligands, the photochemical, chemical and thermal stabilities of the nanocrystal-ligand complexes is determined solely by the length of the hydro carbon chain. The results further show that the thin ligand coat stabilizes the system by slowing down the diffusion of small molecules such as $O_2$ into the inner interface between the nanocrystal and its ligands. The same results were also observed for thiol coated gold nanocrystals.

The discovery that additional side chains on ligands or other bulky molecules that add significant mass to the ligand protein is the driving force behind stability of colloidal suspensions of nanocrystals resulted in the present invention. While adding bulk for mass alone greatly improves the stability of colloidal suspensions of nanocrystals it has been further discovered that by cross linking the multi-chained ligands, the stability of the nanocrystals was further enhanced by at least an order of magnitude.

Figure 2:
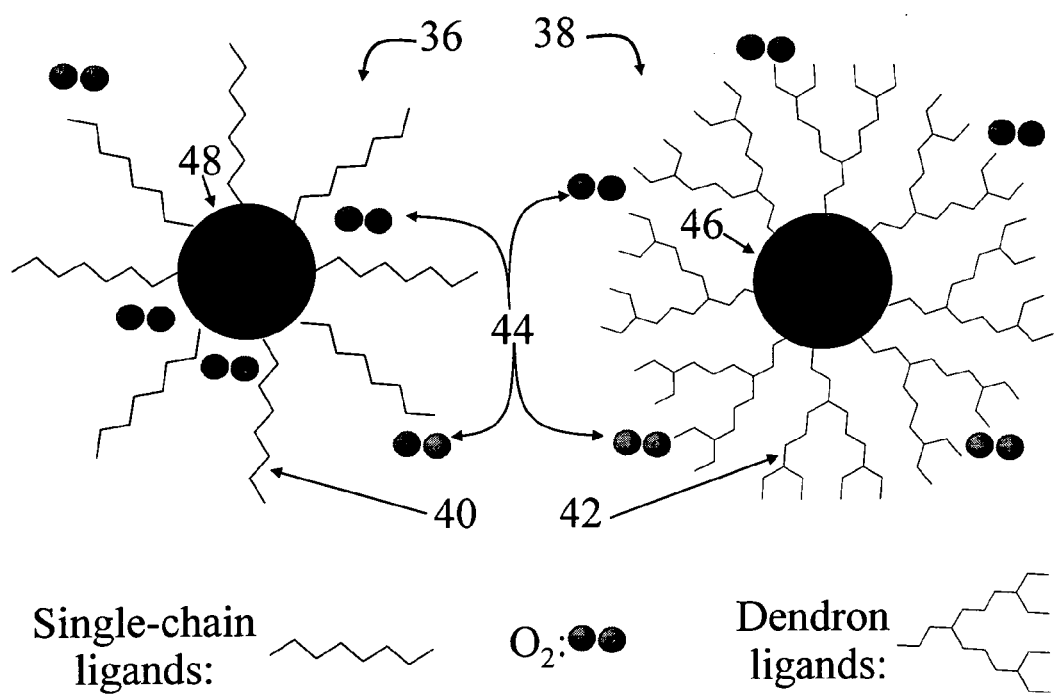
FIG. 2 is a diagrammatic illustration of a ligand protected nanocrystal and a dendron protected nanocrystal.

Organic dendron ligands are regularly hyper-branched organic molecules (examples in FIG. 6) with a central focal point which is used as the binding site for the anionic/metallic elements on the surface of nanocrystals. The number of the branching points along one chain from the focal point to the outer terminal group is the generation number of the dendrons. There are two reasons to choose organic dendron ligands. First of all, their steric crowding characteristics may provide a closely packed but thin ligand shell which may be as efficient as a shell formed by the ligands with a long and floppy single chain. Importantly, the steric crowding of a dendron is very ideal for filling the ligand layer because the dendron ligands can naturally pack in a cone shape on the surface of nanocrystals. Secondly, the inter- and intra-molecular chain tangling of the dendrons with relatively flexible branches may further slow down the diffusion of small molecules or ions from the bulk solution into the interface between a nanocrystal and its ligands. FIG. 2 shows a schematic comparison for the diffusion of $O_2$ from the bulk solution into the inner interface between a nanocrystal and its ligand shell in the cases of simple ligands and dendron ligands. A similar mechanism was actually proposed to explain the improved photoluminescence efficiency of organic dyes encapsulated inside dendrimers.

FIG. 1 shows a diagrammatic illustration of a DP-nanocrystal. Nanocrystal 22 may be comprised of any of a number of inorganic compounds. It may be a combination of elements from groups II and VI or a combination of elements from groups III and V of the periodic table, for example, CdSe or InP. It may also be a noble medal, transition metals, metal oxides, etc. Those skilled in the art will appreciate that these are some of the more common nanocrystals. Those skilled in the art will also appreciate that any nanocrystal that is readily grown in a laboratory may be suitable for the present invention.

Dendrons 24 have NBS's 26 which covalently bind to nanocrystal 22. NBS 26 may be any of a number of functional groups. Those skilled in the art will appreciate that generally nucleophyllic functional groups are most suitable to binding to nanocrystals, i.e. Negatively charged or electron donating functional groups tend to be the best suited for binding to crystals. It is known in the art that thiol functioning groups are very well suited for most compound semiconductor and nobel metals for this purpose. Those skilled in the art will appreciate that both thiol and amine functional groups are particularly well suited for semiconductor nanocrystals especially nanocrystals formed by combinations of elements from groups II and VI or III and V of the periodic table. Thiol NBS groups are also well suited for binding to noble metal nanocrystals. For magnetic nanocrystals, such as iron oxide, iron, cobalt and nickel, NBS's comprised of a carboxylic acid, carboxyl or hydroxyamime functional groups are preferred.

Dendrons 24 are organic molecules having multiple branching chains. Dendrons may be formed by any of a variety of organic compounds known in the art. In this particular embodiment, dendrons 24 have 4 branches. Generally, the more branches of a dendron, the more effective it is at stabilizing and protecting a nanocrystal. Those skilled in the art will appreciate that the more branches dendron 24 has, the more steric hindrance it provides against smaller molecules. The more bulk there is to the dendron, the more difficult it is for oxidizing agents to reach the nanocrystal and oxidize it. This also prevents oxidizing agents from reacting with NBS 26 and causing dendron 24 to dissociate. Ligands having only a single chain are known in the art to be generally ineffective. It was previously believed that the ineffectiveness of single chain ligands was due primarily to instability of the thiol NBS's. One of the significant features of the present invention is the discovery that the ineffectiveness of single chain ligands is largely due to their inability to effectively coat a nanocrystal. By utilizing ligands having multiple chains such as dendrons 24, much greater protection is provided for the nanocrystal. In addition, multi chain dendrons protect their own NDS alleviating any instability in their covalent bonds to the nanocrystal by blocking agents that would dissociate them. This is a vast improvement over the previous attempts which involved adding thiol groups to the ligand.

At the ends of dendron's 24 branches, active sites 30 are located. Active sites 30 preferably perform two functions. First, they interact with the immediate environment, that is, the solution in which the nanocrystals are suspended. If the nanocrystals are placed in an aqueous solution or solid matrix, active sites 30 are preferably hydrophilic. Alternatively, if the nanocrystals are placed in an oily solvent, active sites 30 would be preferably hydrophobic. Those skilled in the art will appreciate that the nature of the solution will determine what active site is desired.

Second, active sites 30 preferably interact with each other in order to cross link dendrons 24. Those skilled in the art will appreciate that there are a large variety of cross linking functional groups, only a few of which will be described herein. Another important aspect of the present invention is the use of active sites 30 to cross link dendrons 24. This causes dendrons 24 to form a densely packed coating about nanocrystal core 22. The cross linking acts synergistically along with multi chain dendrons to further stabilize nanocrystal 22. The tight packing of the dendron coating significantly enhances the resistance of the nanocrystal-ligand complexes to oxidizing agents and other deleterious molecules that cause either deterioration or dissociation. Furthermore, even if a dendron's NBS looses its covalent bond to nanocrystal 22, it will not fall into solution, but will rather remain part of the dendron coating. This is because the dendron is also covalently bound to neighboring dendrons my means of cross linked active sites. By using cross linked, multi chained dendrons to coat a nanocrystal, the problems found in the prior art are essentially eliminated.

FIG. 2 illustrates the advantages of using multi chain dendrons. Nanocrystal 36 is protected by single chain ligands 40. Alternatively, dendron protected nanocrystal 38 is protected by multi chain dendrons 42. Ligands 40 are insufficient to sterically hinder oxidizing agent 44. Even though dendrons 42 are not cross linked, their bulk blocks agents 44 from reaching the surface of nanocrystal 46. Single chain ligands 40 lack the bulk to sterically hinder agents 44 which readily reach the surface of nanocrystal 48. Although not shown in this illustration, it is generally preferred to cross link dendrons 42.

Figure 3:
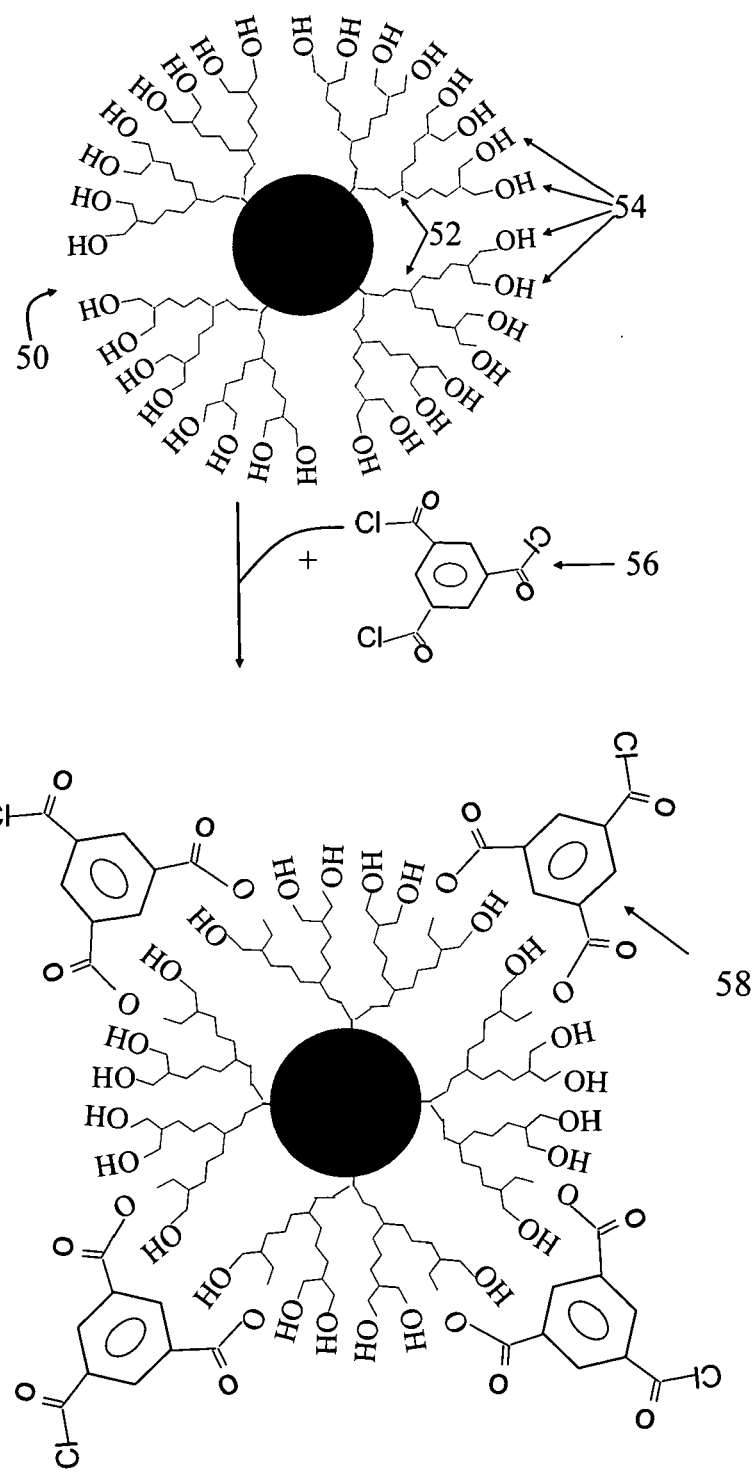
FIG. 3 shows a diagrammatic illustration of a dendron cross-linking reaction for the present invention.

Cross-linking of dendron ligands is generally accomplished by the formation of relatively strong molecular interactions. Cross-linking methods other than hydrogen bonding and electrostatic interactions require cross-linking reagents. For the formation of inorganic complexes, inorganic ions are used as the cross-linking reagents. Cross-linking can also be performed by using those cross-linking reagents which can form multiple covalent bonds with the active sites of different ligands. FIG. 3 shows one simple example of such multi-functional cross-linking reagents. If it is necessary, multiple cross-linking strategies may be applied.

Figure 5:
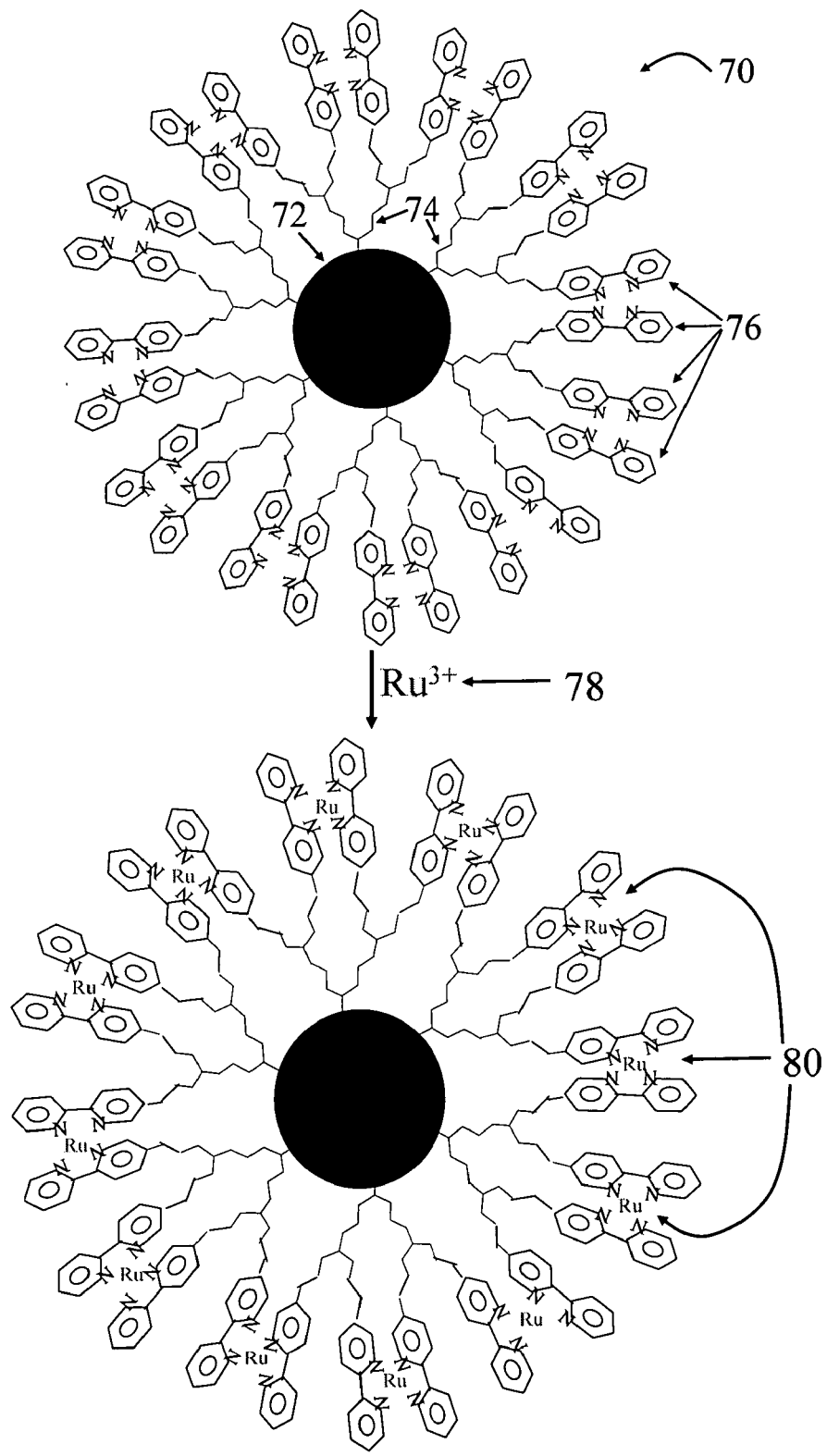
FIG. 5 shows a diagrammatic illustration of an alternative cross linking method for the present invention.

FIG. 3 illustrates one such cross linking reaction. DP nanocrystal 50 is protected by dendrons 52. Dendrons 52 have active sites 54 comprised of hydroxyl groups. Cross linker 56 is added to the solution in which nanocrystal 50 is suspended. Cross linker 56 interacts with the hydroxyl groups of active sites 54 to result in cross links 58. For simplicity, FIG. 3 shows only a partial ligand coating on nanocrystal 50. Another advantage of using a multi chained dendron is that it is unnecessary to carry the cross linking reaction to 100% completion. Because each dendron has multiple active sites, the cross linking reaction that only reaches partial completion will sufficiently cross link the dendron ligands on the surface of a nanocrystal. The cross linking reaction illustrated in FIG. 3 is well suited for nanocrystals in a hydrophilic environment. If single chain, ligands are used, unless 100% completion of the cross linking reaction is achieved, it results in a ligand coat that may still partially dissociate and cause the nanocrystal to deteriorate. Single chain ligands can be sufficiently cross-linked by applying multi-step cross-linking, or using ligands capable of multi-cross-linking reactions, such as covalent bonding as shown in FIG. 3 and complex formation as shown in FIG. 5. Therefore, the present invention may be applied to stabilization via single chain ligands.

Figure 4:
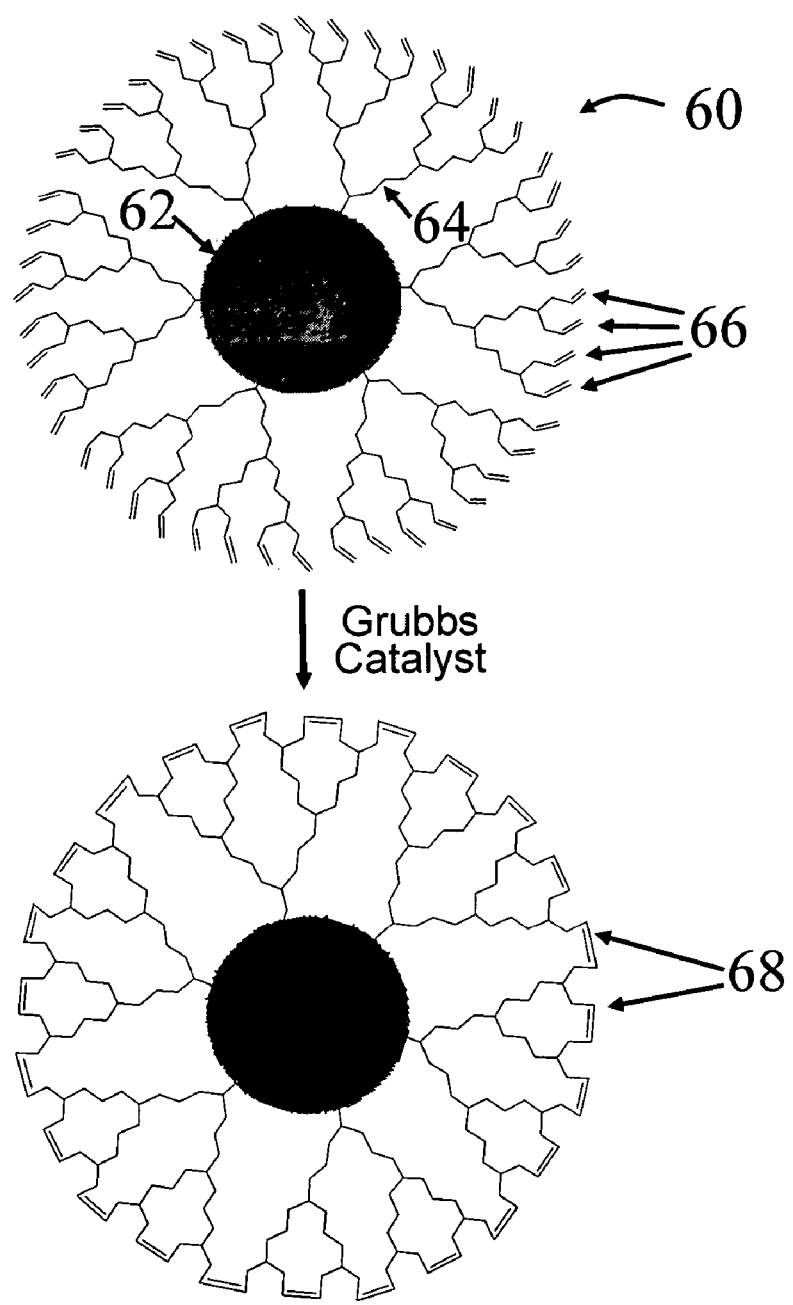
FIG. 4 shows a diagrammatic illustration of an alternative cross linking reaction for the present invention.

FIG. 4 is a partial illustration of a DP nanocrystal suitable for suspension in hydrophobic solutions. DP nanocrystals 60 is comprised of a nanocrystal 62 having dendrons 64 bound to it. Active sites 66 of dendrons 64 are comprised of ethylene groups. Those skilled in the art will appreciate that if a Grubbs catalyst is combined DP nanocrystals 60 it will catalyze a reaction causing active sites 66 to cross link, thus forming cross links 68. This results in the formation of a hydrophobic dendron coat about crystal 62.

FIG. 5 is a partial illustration of another method of protecting nanocrystals with cross linked dendrons. DP nanocrystal 70 is comprised of nanocrystal 72 having covalently bound dendrons 74. Dendrons 74 have active sites 76 comprised of bipyridine. When these DP nanocrystals are combined with ruthenium or other transition metal ions, neighboring bipyridine active sites form a cross linking complex 80 with the ruthenium. Cross linking complexes 80 are highly stable. Those skilled in the art will be familiar with the bipyridine/$Ru^{3+}$ complex and other types of complexes suitable for this purpose. However, this is the first instance in which this complex has been designed to cross link dendron ligands on the surface of colloidal nanocrystals.

The thiol group is a preferred NBS because of its versatile coordination chemistry to semiconductor and noble metal nanocrystals. For the biomedical applications of colloidal semiconductor and nobel metal nanocrystals, the outer terminal groups of the dendron ligands may be amides, carboxylic acids, alcohols or esters, which resemble that of a hydrophilic protein or a sugar. The branches of a dendron ligand may not be completely symmetric, because it may potentially provide better steric crowding efficiency over the entire ligand shell and a more efficient coupling reaction. Experimental results indicate that the dendron ligands described in this paragraph work well for differently sized CdSe nanocrystals and gold nanocrystals dispersed in water and polar solvents.

Figure 6:
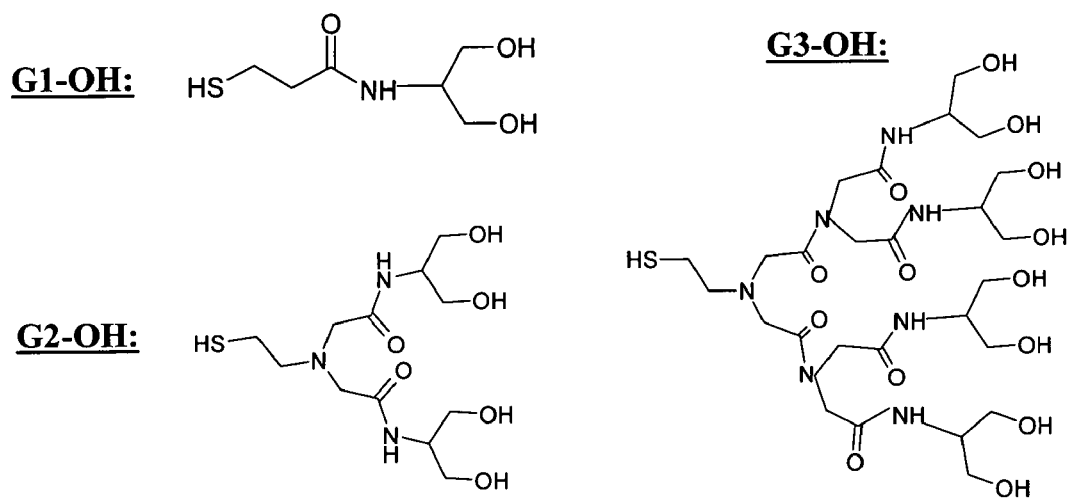
FIG. 6 shows a diagrammatic illustration of various ligands utilized to protect nanocrystals.
Figure 7:
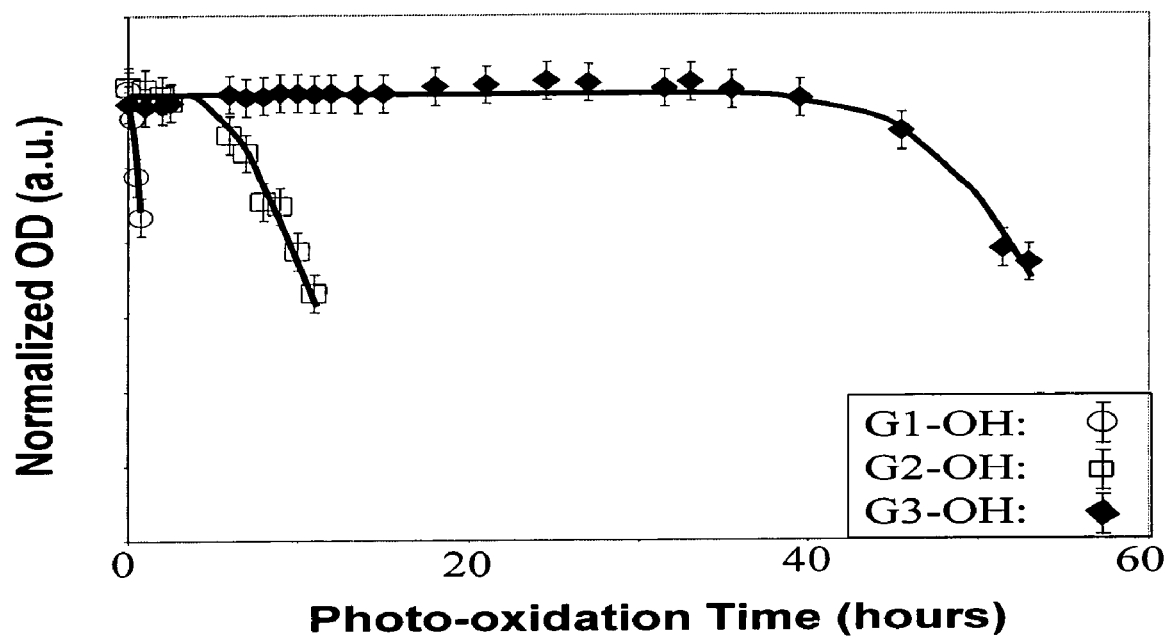
FIG. 7 shows a graph illustrating the effectiveness of dendrons for protecting nanocrystals.

Photochemical, thermal and chemical stability of the DP-nanocrystals is exceptionally good in comparison to the nanocrystals coated by single-chain thiol ligands. For semiconductor nanocrystals, such as CdSe nanocrystals, the normalized OD at the original excitation absorption peak of the nanocrystals was used as the indicator of the photo-oxidation of the nanocrystals. FIG. 7 illustrates that the photochemical stability of the CdSe nanocrystals increases with the increase of the number of the generation of the dendron ligands with a similar structure. The molecular structure of the thiol dendrons are illustrated in FIG. 6. Without additional UV radiation, the aqueous solution of G2 and G3 dendron-nanocrystals after removing excess ligands can be stored under ambient conditions for at least several months without any precipitation. As described below, this exceptional stability of the CdSe nanocrystals coated by the G2 or G3 dendrons is sufficient for necessary coupling and purification procedures.

Previously reported results reveal that the photochemical stability of nanocrystal/ligand complexes can be improved significantly by simply increasing the molecular weight of the single chain ligands. That is so because the longer the chain is, the thicker the ligand layer will be. For this reason, it was important to verify that the improved stability of dendron-nanocrystals is not simply caused by the increase of the molecular weight of the dendrons. Three ligands with different degrees of branches but with a similar molecular weight shown in FIG. 6 were studied to clarify this issue. The experimental results indicated that the stability of the CdSe nanocrystal/ligand complexes is strongly associated with the degree of the branching of the ligands.

Gold nanocrystals coated by single-chain thiols, such as MUA, are generally very fragile. They can not withstand precipitation by sodium chloride solution and the resulting precipitate is insoluble in pure water. They have to be purified by ultracentrifuge that does not convert the nanocrystal/ligand complex into solid/powder form. In contrast, the gold dendron-nanocrystals can be precipitated by sodium chloride solution and be re-dispersed in water repeatedly. In general, the gold DP-nanocrystals are more stable against photo-oxidation than the corresponding CdSe dendron-nanocrystals.

Figure 8:
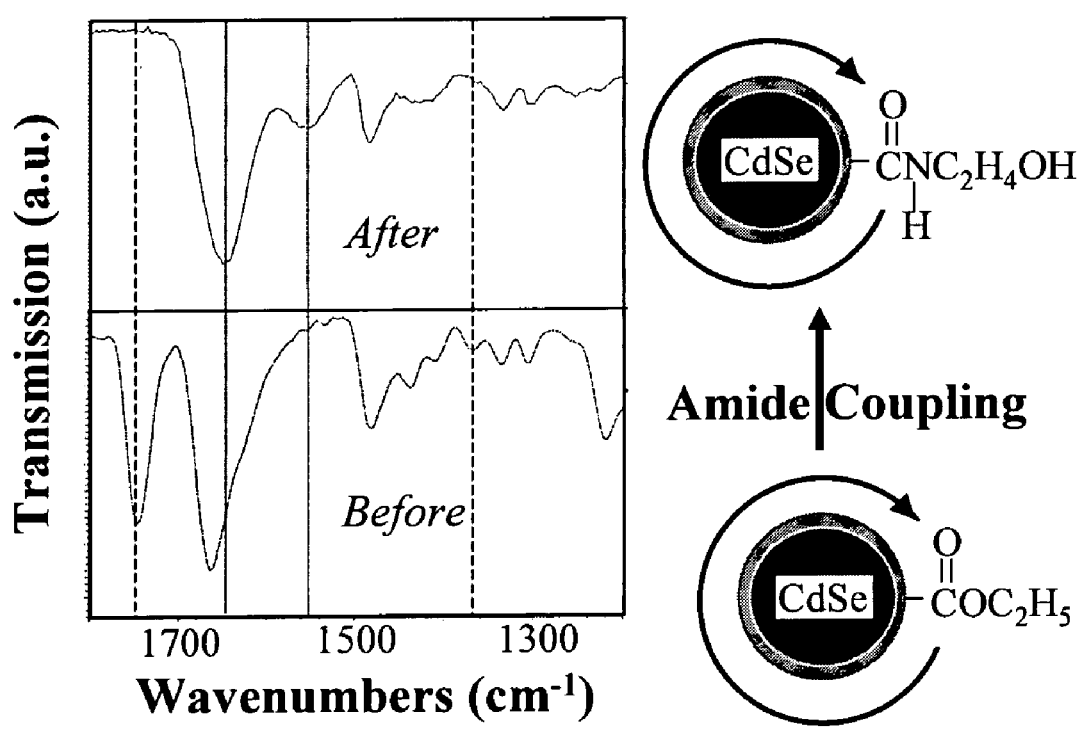
FIG. 8 shows IR spectrums illustrating the effectiveness of an amide coupling reaction.
Figure 9:
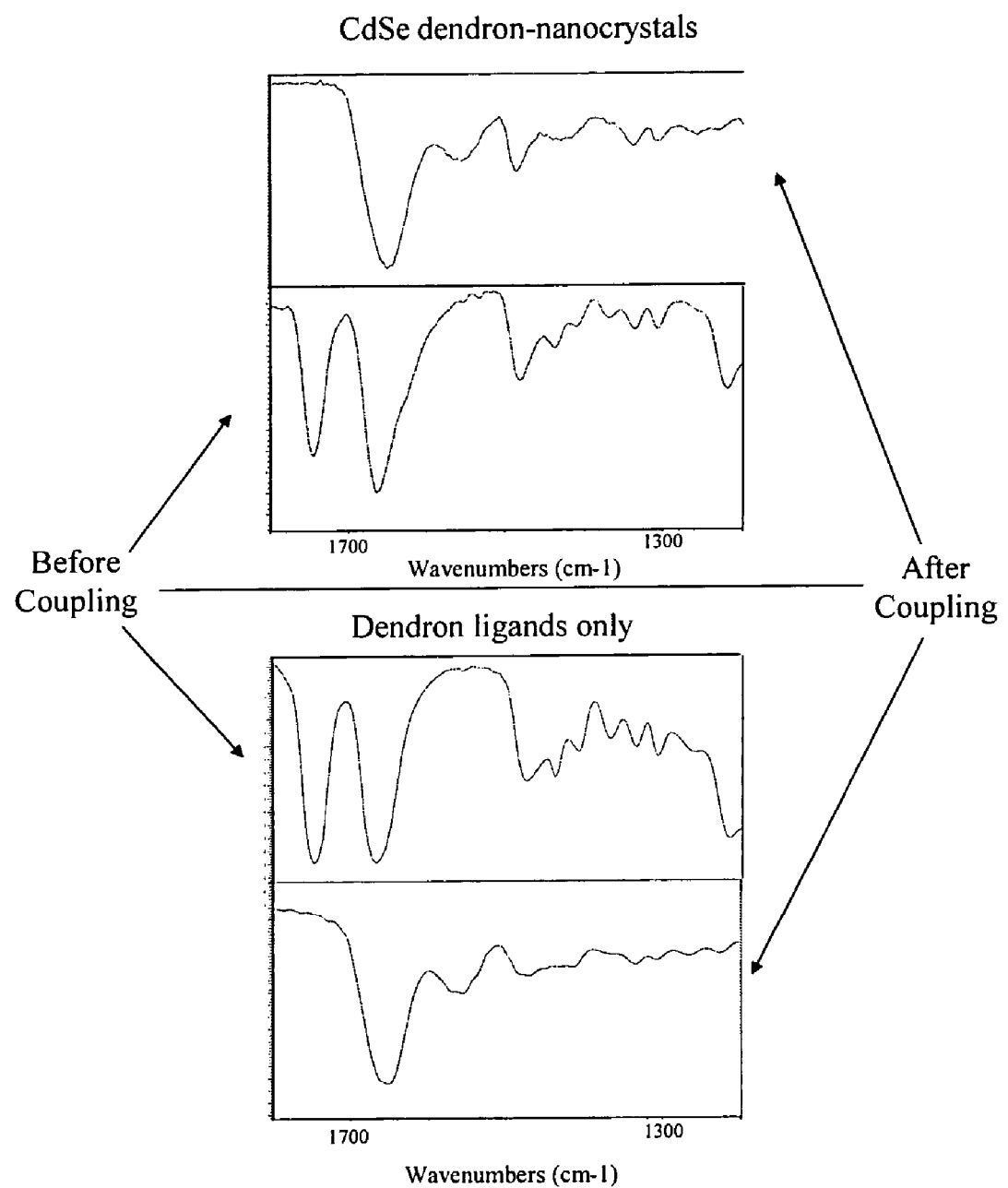
FIG. 9 shows the IR spectra of dendron protected nanocrystals compared to dendrons alone.
Figure 10:
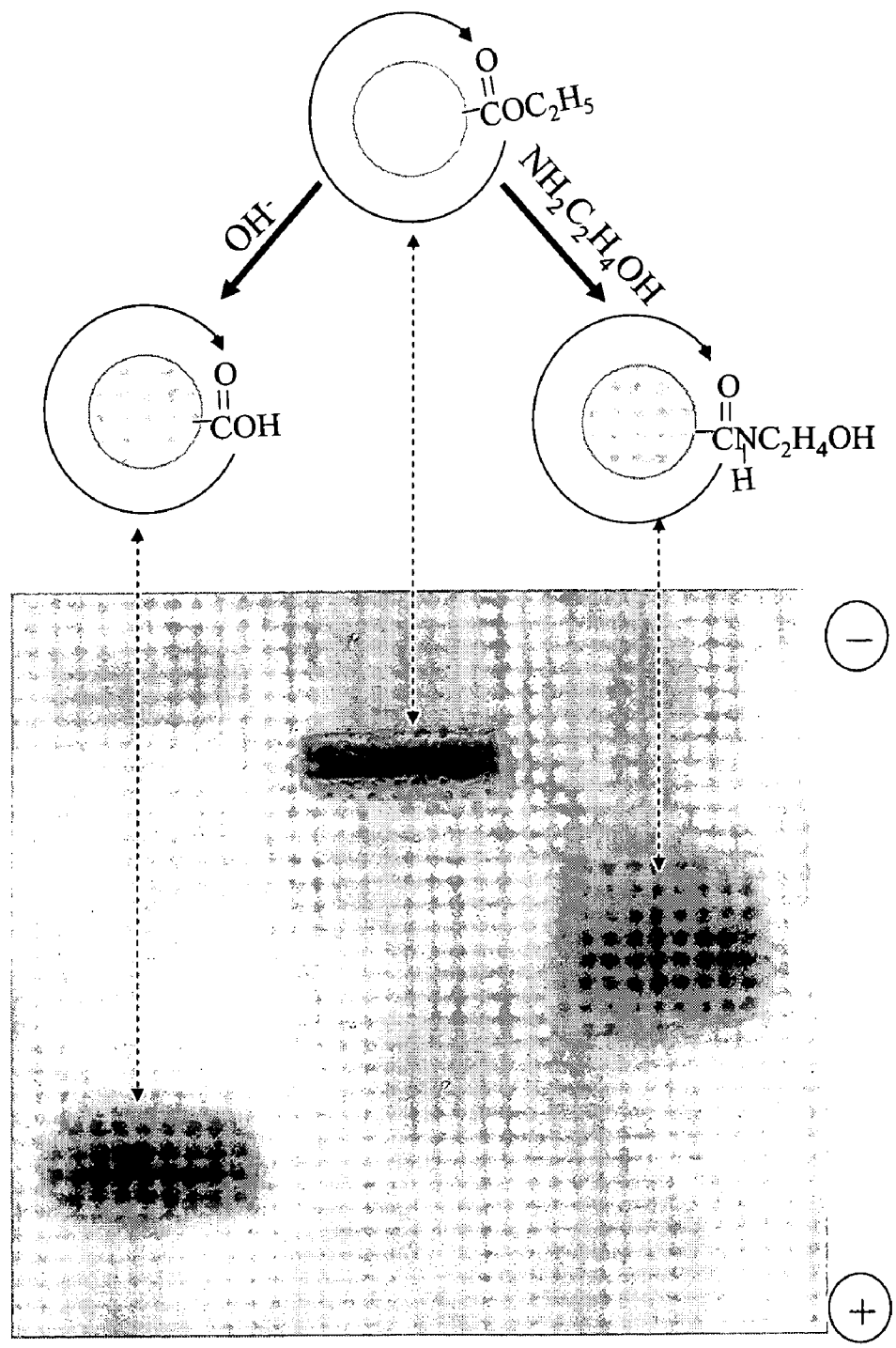
FIG. 10 shows the results of a gel-electrophoresis assay of dendron protected nanocrystals before and after two different chemical reactions.

For biological applications, it is essential that nanocrystal/ligand complexes should be stable enough for certain types of coupling reactions which conjugate biologically active species to the nanocrystal/ligand complex. Amide coupling of the dendron-nanocrystals through either the ester-amine coupling or the traditional EDC coupling works well. Several types of primary amines, such as glycineamide, 2-aminoacetonitrile, benzylamine, 2-aminoethanol and ammonia were successfully coupled to the outer surface of the DP-nanocrystals. The solubility of the DP-nanocrystals is largely dependent on the resulting amide. For example, the ester terminated CdSe dendron-nanocrystals were only soluble in organic solvents. After reacting with ammonia or 2-aminoethanol, the dendron-nanocrystals became only soluble in water. Infrared (IR) and $H^1$ NMR studies revealed that the ester-amine coupling reaction could be close to 100% completion. The ester stretching vibration band at around 1740 $cm^{-1}$ and the methyl deformation mode at 1370 $cm^{-1}$ disappeared completely after the CdSe dendron-nanocrystals reacted with aminoethanol liquid for about 10 minutes at 100° C., see FIG. 8. The peaks appeared at about 1640 $cm^{-1}$ and 1550 $cm^{-1}$ in the spectrum of the resulting nanocrystals of the coupling reaction are due to the secondary amide vibration modes, which indicates the formation of the new amide bonds. The IR spectra of the CdSe dendron-nanocrystals, either before or after the ester coupling reactions, are nearly identical to those of their corresponding free ligands, see FIG. 9. If dendron-nanocrystals were terminated with —COOH groups, amide coupling was accomplished through the traditional EDC coupling, and similar IR results were observed.

The other requirement for biomedical applications is that the DP-nanocrytal conjugates with biological functional groups in a manner stable enough to withstand separation processes. The separation and purification of dendron-nanocrystals can be carried out by conventional techniques. Both CdSe and Au DP-nanocrystals can pass through an adequate chromatography column readily. The CdSe dendron-nanocrystals without any excess ligands were able to stay in a Sephadex G-25 (or NAP™-10) column with room light for hours without leaving any residues after the nanocrystals run through in a tight band. In contrast, the CdSe nanocrystals coated by MPA were completely smeared and could not be washed out under the same conditions.

The CdSe DP-nanocrystals can be purified and separated by Gel-Electrophoresis without any excess ligands. The negatively charged dendron-nanocrystals run toward the positive electrode. The original ester terminated DP-nanocrystals did not move on the gel because they were insoluble in water. In contrast, the two reaction products were moved in two tight bands on the gel with distinguishable mobilities. After gel-electrophoresis, the DP-nanocrystals can be completely recovered back into pure water. UV-Vis study revealed that the nanocrystals recovered from the gel was unchanged. However, it is helpful to cover the gel electrophoresis chamber during the electrophoresis to avoid the room light radiation because of the strong oxidation environment in the chamber. Coated with conventional single-chain thiol ligands, both CdSe and Au nanocrystals cannot survive through the separation/recovering process without a large excess of free thiol ligands.

The coupling reactions presented here are common ones for coupling functional organic/biological species onto solid substrates although they have been unachievable for the CdSe and other semiconductor nanocrystals coated by single-chain thiol ligands without excess free ligands in the solution. The success of these reactions show that these stabilized nanocrystals are suitable labeling agents for various biomedical assays, such as labels on antibodies for immunoassays and labels on polynucleotide probes for polynucleotide hybridization assays. Similar to the coupling reactions, gel electrophoresis has also been very difficult to perform for semiconductor nanocrystals. Excess free ligands were found necessary for the gel electrophoresis of semiconductor and large-sized gold nanocrystals, and the nanocrystals were often not recoverable.

The dendron ligands reported here have dramatically improved the photochemical stability of nanocrystals.

If the resulting ligands generated by the photo-catalytic oxidation occur on the surface of nanocrystals designed to be insoluble in the solvent, the oxidized ligands will still surround the inorganic core to form a micelle structure although there were no chemical bonds between the ligands and the inorganic cores. If the inorganic core is stable against photo-oxidation, the resulting nanocrystal/ligand complex remains soluble and processable. Insoluble ligand shells may be achievable for the dendron ligands by inter-molecular cross-linking between the chains by multiple hydrogen bonds, covalent bonds, or other relatively strong interactions as described above. For the inorganic core, active semiconductor and metal nanocrystals can be coated by another inorganic component prior to the surface modification by dendron ligands to make them photo-oxidation inactive.

Certain types of dendron ligands can presumably be used for the synthesis of high quality semiconductor nanocrystals, provided the recent discovery of many alternative routes towards high quality semiconductor nanocrystals. With rationally designed ligands, stable nanocrystals may be prepared with desired functionality. The thiol based ligands described in this paper cannot be used for the synthesis of high quality semiconductor nanocrystals because thiols were found to be incompatible with the existing synthetic schemes. Dendron ligands using carboxylic acid, amine, phosphine oxide, or phosphonic acid groups as the nanocrystal binding sites may be used for the direct synthesis of high quality semiconductor nanocrystals and magnetic nanocrystals. The thiol based dendrons presented in this invention may be applied for the synthesis of stable noble metal nanocrystals using the existing methods.

The inter- and intra-molecular chain tangling between the branches of dendrons have played an important role for stabilizing the semiconductor nanocrystals, in addition to the steric crowding feature of the dendrons. Dendron ligands have may also be for the synthesis of gold nanocrystals using different generations of quinone-based (—C═O) hydrophobic dendrons with rigid branches in hope to control the size of gold nanocrystals by the different generation dendrons. The results indicated that the gold nanocrystals synthesized with high generation dendrons have a strong tendency to aggregate, which is different from the results of this work. Their results may be caused by the rigid branches of their dendrons, which cannot provide sufficient steric crowding on the surface of nanocrystals and do not possess inter- and intra-molecular chain tangling.

The cone-shaped structural feature and the single binding site of a dendron ligand provides a better packing in the ligand shell and an unambiguous orientation of the ligands on the surface of nanocrystals.

The experimental results confirmed that the photochemical stability of semiconductor and noble metal nanocrystal/ligand complexes is the key for the development of reliable processing chemistry for these nanocrystals. The surface-modification chemistry of the nanocrystals with dendron ligands is simple and straightforward. The thickness of the ligand layer of the dendron-nanocrystals can be as thin as about 1 nm to achieve substantial stability for those dendron-nanocrystals to be manipulated as standard chemical reagents. The chemistry related to CdSe dendron-nanocrystals can be applied for developing photoluminescence-based labeling reagents using semiconductor nanocrystals for biomedical applications. The chemistry presented also provides an alternative path to apply noble metal nanocrystals for chemical and biomedical applications. The invention also creates many new opportunities in the field of colloidal nanocrystals and related materials since it allows simple and affordable processing chemistry. For example, stable magnetic dendron-nanocrystals represent a new avenue for using magnetic nanocrystals for drug delivery and enhanced magnetic resonance imaging.

Those skilled in the art will appreciate that there are a variety of dendron ligands not disclosed herein but would be suitable for stabilizing many different types of colloidal nanocrystals. It is preferable that the dendrons are not overly bulky. It is desirable to have a relatively thin organic dendron coating about the nanocrystal. An excessively thick dendron coating will have deleterious effects on the electronic and structural properties of the nanocrystals. Otherwise, any number of dendrons may be used in the present invention. An important aspect of the dendrons is that they are sufficiently bulky to sterically hinder deleterious molecules.

Whereas, the present invention has been described in relation to the drawings attached hereto, it should be understood that other and further modifications, apart from those shown or suggested herein, may be made within the spirit and scope of this invention.

What is claimed is:

1. A nanoparticle composition comprising: a nanoparticle coated with a plurality of dendron ligands covalently bound to a surface of the nanoparticle.

2. The nanoparticle composition of claim 1 wherein the nanoparticle is a nanocrystal.

3. The nanoparticle composition of claim 1 wherein each dendron ligand comprises at least one nanoparticle binding site and at least one active sites.

4. The nanoparticle composition of claim 3 wherein the at least one active site is hydrophobic.

5. The nanoparticle composition of claim 3 wherein the at least one active site is hydrophilic.

6. The nanoparticle composition of claim 3 wherein the at least one active site is selected from the group consisting of hydroxyl groups, amine groups, ethylene groups, carboxylic acid groups, carbonyl groups, halide groups, bipyridine groups, and ester groups.

7. The nanoparticle composition of claim 3 wherein the at least one nanocrystal binding site is selected from the group consisting of thiol, carboxylic acid, hydroxylamide, phosphine, amine, phosphine oxide, and phosphonic acid.

8. The nanoparticle composition of claim 3, wherein each dendron ligand comprises a plurality of active sites.

9. The nanoparticle composition of claim 1 wherein the nanoparticle comprises a material selected from the group consisting of gold, silver platinum, copper, iridium, palladium, silicon, germanium, iron, cobalt, nickel, iron oxide, cobalt oxide, nickel oxide, titanium oxide, zinc oxide, cadmium selenide, cadmium sulfide, cadmium telluride, zinc sulfide, zinc selenide, zinc telluride, mercury sulfide, mercury selenide, mercury telluride, indium phosphorus, indium arsenide, indium nitride, gallium arsenide, gallium phosphide, gallium nitride, gallium selenide, gallium sulfide, indium selenide, indium sulfide and indium telluride.

10. The nanoparticle composition of claim 1 wherein the nanoparticle comprises a combination of elements from the noble metals, transition metals, metal oxides, metal halides, group IV, groups II and VI or groups III and V.

11. The nanoparticle composition of claim 1, wherein at least one branch of a first dendron ligand is crosslinked to a second dendron ligand.

12. The nanoparticle composition of claim 11, further comprising a crosslinking agent.

13. The nanoparticle composition of claim 1, wherein the nanoparticle is photoluminescent.

14. The nanoparticle composition of claim 1, wherein the nanoparticle is stable in a solution or solid matrix.

15. A laser or LED comprising a nanoparticle coated with a plurality of dendron ligands covalently bound to a surface of the nanoparticle, wherein the nanoparticle emits photoradiation upon photo or electronic excitation.

16. A nanoparticle composition comprising:
a nanoparticle coated with a plurality of dendron ligands, wherein each dendron ligand comprises at least one nanoparticle binding site.

17. The nanoparticle composition of claim 16, wherein the nanoparticle comprises a group IV element, a combination of elements from groups II and VI, a combination of elements from groups III and V, transition metals, transition metal oxides, or a combination of elements from metals and non-metals.

18. The nanoparticle of claim 16, wherein the nanoparticle comprises gold, silver platinum, copper, iridium, palladium, silicon, germanium, iron, cobalt, nickel, iron oxide, cobalt oxide, nickel oxide, titanium oxide, zinc oxide, cadmium selenide, cadmium sulfide, cadmium telluride, zinc sulfide, zinc selenide, zinc telluride, mercury sulfide, mercury selenide, mercury telluride, indium phosphorus, indium arsenide, indium nitride, gallium arsenide, gallium phosphide, gallium nitride, gallium selenide, gallium sulfide, indium selenide, indium sulfide and indium telluride.

19. The nanoparticle composition of claim 16, wherein the dendron ligands further comprise at least one active site.

20. The nanoparticle composition of claim 16, wherein the dendron ligands comprise a plurality of active sites.

21. The nanoparticle composition of claim 16, wherein at least one branch of a first dendron ligand is crosslinked with a second dendron ligand.

22. The nanoparticle composition of claim 21, further comprising a crosslinking agent.

23. The nanoparticle composition of claim 16, wherein the nanoparticle is photoluminescent.

\* \* \* \* \*